United States Patent [19]

Babin

[11] Patent Number: 4,951,005
[45] Date of Patent: Aug. 21, 1990

[54] PHASE LOCKED LOOP WITH REDUCED FREQUENCY/PHASE LOCK TIME

[75] Inventor: David C. Babin, Austin, Tex.

[73] Assignee: Motorola, Inc., Schaumburg, Ill.

[21] Appl. No.: 457,465

[22] Filed: Dec. 27, 1989

[51] Int. Cl.⁵ .............................................. H03L 7/18
[52] U.S. Cl. ................................... 331/16; 331/1 A; 331/25
[58] Field of Search ..................... 331/1 A, 16, 18, 25, 331/27; 455/260

[56] References Cited

U.S. PATENT DOCUMENTS 4,378,509 3/1983 Hatchett et al. ............... 331/1 A X
4,714,899 12/1987 Kurtzman et al. ................ 331/1 A Primary Examiner—David Mis
Attorney, Agent, or Firm—Robert L. King; Paul J. Polansky

[57] ABSTRACT

A phase locked loop for providing a programmable frequency output signal with reduced phase-frequency lock time. A phase detector detects a phase difference between a reference frequency divided by a first number, and a frequency of the output signal divided by a second number. First and second counters receive the first and the second input numbers to divide a respective frequency. Whenever an input number is loaded, a load signal resets the phase detector and causes each counter to be loaded, which reduces the lock time of the loop.

10 Claims, 2 Drawing Sheets

PHASE LOCKED LOOP WITH REDUCED FREQUENCY/PHASE LOCK TIME

FIELD OF THE INVENTION

This invention relates generally to phase locked loops, and more particularly, to programmable, digital phase locked loops used for frequency synthesizers.

BACKGROUND OF THE INVENTION

Phase locked loops (PLLs) have important uses in communications applications. A PLL frequency synthesizer, one such use, generates an output signal having a programmable frequency to be used in tuning of two or more communication channels. Typically, a microprocessor programs the frequency of the output signal. In many applications, the programmed frequency must change dynamically. For example, the frequency normally generated by the PLL frequency synthesizer is used to tune a communications signal, but periodically the frequency must be changed to tune an auxiliary channel. The functioning of the phase locked loop may be enhanced by using a digital phase detector to measure a phase difference between the output signal and a proportion of a reference signal, and to adjust the output signal in response to a detected phase difference. Performance of PLL frequency synthesizers using digital phase detectors must continually be improved to meet increased performance requirements of communication circuits.

BRIEF DESCRIPTION OF THE INVENTION

Accordingly, it is an object of the present invention to provide a phase locked loop with improved lock time.

It is another object of the present invention to provide a phase locked loop with an improved phase detection mechanism.

In carrying out these and other objects of the invention, there is provided, in one form, a phase locked loop comprising an input portion, a reference portion, a phase detection portion, and a loop portion. The input portion stores a first and a second predetermined number in response to a plurality of input signals. The reference portion is coupled to the input portion, and provides a first signal in response to the first predetermined number of cycles of a reference signal, a second signal in response to the second predetermined number of cycles of an output signal, and both the first signal and the second signal in response to the input portion storing either the first predetermined number or the second predetermined number. The phase detection portion is coupled to the reference portion, and provides a phase difference signal in response to a difference in logic state between the first signal and the second signal. The loop portion is coupled to the phase detection portion and to the reference portion, and provides the output signal as a frequency proportional to the phase difference signal.

These and other objects, features and advantages will be more clearly understood from the following detailed description taken in conjunction with the accompanying drawings.

DETAILED DESCRIPTION OF THE INVENTION

Figure 1:
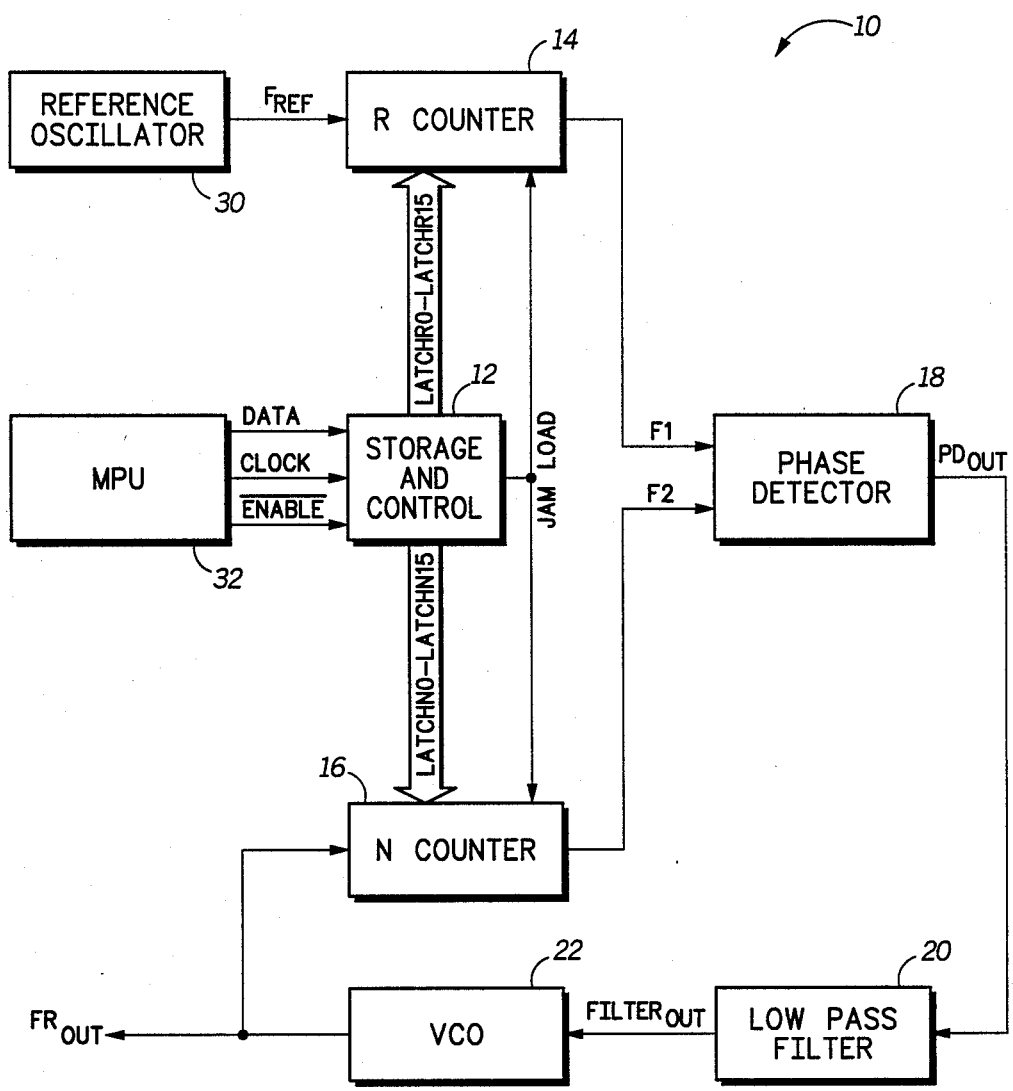
FIG. 1 illustrates in block diagram form a phase locked loop in accordance with a preferred embodiment of the present invention.

FIG. 1 illustrates in block diagram form a phase locked loop 10 in accordance with a preferred embodiment of the present invention. Phase locked loop 10 comprises a storage and control portion 12, an R counter 14, an N counter 16, a phase detector 18, a low pass filter 20, and a voltage controlled oscillator (VCO) 22. Also shown are a reference oscillator 30, and a microprocessor (MPU) 32, which are not a part of phase locked loop 10. Oscillator 30 provides a reference signal labelled "$F_{REF}$" at a reference frequency to counter 14. Counter 14 provides a first signal labelled "F1" to phase detector 18, and receives sixteen signals labelled "LATCHR0-LATCHR15" and a signal labelled "JAM LOAD" from storage and control portion 12. Microprocessor 32 provides three signals, "DATA", "CLOCK", and "$\overline{\text{ENABLE}}$" to storage and control portion 12. Counter 16 receives sixteen latch signals "LATCHN0-LATCHN15" and JAM LOAD from storage and control portion 12. Counter 16 also receives an output signal labelled "$FR_{OUT}$" from voltage controlled oscillator 22, and provides a second signal labelled "F2" to phase detector 18. Phase detector 18 receives F1 and F2 and provides an phase detect output signal labelled "$PD_{OUT}$" to filter 20. Filter 20 receives $PD_{OUT}$ and generates a filtered signal labelled "$FILTER_{OUT}$". Voltage controlled oscillator 22 receives $FILTER_{OUT}$ and provides $FR_{OUT}$ in response.

In operation, phase locked loop 10 generates $FR_{OUT}$ at a programmable frequency in response to a frequency of reference signal $F_{REF}$ and two 16-bit numbers. Microprocessor 32 receives one or more instructions to send a first number or a second number through a serial microprocessor port. Microprocessor 32 provides input signals DATA, CLOCK, and $\overline{\text{ENABLE}}$ in response to the instruction or instructions. $\overline{\text{ENABLE}}$ is asserted, and 17 bits are provided serially on DATA by microprocessor 32, one bit per each CLOCK cycle. The first bit is an address bit to determine whether the first number or the second number follows. The following sixteen bits is the input number.

After receiving the address bit, storage and control portion 12 shifts each bit on DATA into a shift register. When the sixteenth bit of the input number is received, storage and control portion 12 stores the input number in a corresponding latch (not shown in FIG. 1). A latch associated with the first number provides signals LATCHR0–LATCHR15, and a latch associated with the second number provides signals LATCHN0-LATCHN15. Since CLOCK and $F_{REF}$ are asynchronous with respect to each other, an incorrect value may be read if either counter tries to read the value of the latch while the number is being stored in the latch. However, JAM LOAD is asserted following reception of an input number, and causes counter 14 and counter 16 to reload the first number and the second number, respectively, solving the first problem.

Counter 14 is loaded with the first number and decrements once for each cycle of $F_{REF}$. Counter 14 provides F1 at a logic low until counter 14 reaches terminal count, provides F1 at a logic high, then automatically reloads the first predetermined number on LATCHR0-LATCHR15 and provides F1 again as a logic low. Similarly, counter 16 is loaded with the second number and decrements once for each cycle of $FR_{OUT}$. Counter 16 provides F2 at a logic low until counter 16 reaches terminal count, provides F2 at a logic high, and then automatically reloads the second predetermined number on LATCHN0-LATCHN16 and provides F2 as at a logic low. Both cycles repeat indefinitely.

Phase detector 18 receives F1 and F2 and generates $PD_{OUT}$ as a phase difference between F1 and F2. If F1 and F2 are both a logic low, then $PD_{OUT}$ is provided at a high impedance state. If F1 is high when F2 is low, $PD_{OUT}$ is provided at a logic high; if F1 is low when F2 is high, $PD_{OUT}$ is provided at a logic low. If both F1 and F2 are at a logic high, a state machine in phase detector 18 is reset asynchronously to the "00" state corresponding to F1 and F2 each being at a logic low. Filter 20 is a low pass filter, and provides an output signal $FILTER_{OUT}$ whose magnitude is proportional to the average value of $PD_{OUT}$. If $PD_{OUT}$ is provided as a logic high, then the magnitude of $FILTER_{OUT}$ increases; if $PD_{OUT}$ is provided as a logic low, the magnitude of $FILTER_{OUT}$ decreases; and if $PD_{OUT}$ provided in a high impedance state, the magnitude of $FILTER_{OUT}$ stays substantially constant. $FILTER_{OUT}$ is then received by voltage controlled oscillator 22 and $FR_{OUT}$ is generated at a frequency proportional to the voltage level of $FILTER_{OUT}$. The frequency of $FR_{OUT}$ stabilizes when F1 and F2 are substantially the same.

Together, counter 16, phase detector 18, filter 20, and voltage controlled oscillator 22 provide a phase locked loop which, when used in conjunction with counter 14 receiving $F_{REF}$, allows the user to provide a digitally controlled output signal at a programmable frequency. The programmable frequency is determined by the values of $F_{REF}$, the first number, and the second number.

When storage and control portion 12 receives a new value for either the first number or the second number, counters 14 and 16 provide both F1 and F2 as a logic high. In response to F1 and F2 being provided in a logic high state, counter 14 and counter 16 load the counter values from LATCHR0-15 and LATCHN0-15, respectively. Providing F1 and F2 in this manner solves four problems associated with using a digital phase detector in PLL frequency synthesizers and like circuits having programmable divide ratios. The four problems are detailed below.

First, counters 14 and 16 periodically reload the first and second numbers from storage and control portion 12 every time the counters decrement to zero (known as terminal count). However CLOCK, used by microprocessor 32 to load the first and second numbers, is asynchronous to both $F_{REF}$ and $FR_{OUT}$. Occasionally, therefore, an input number is being latched when a counter tries to read it, resulting in an incorrect, indeterminate value being read by the counter. The correct value is loaded the next time the counter reads the number, but until then, $FR_{OUT}$ is incorrect and cannot begin to lock. One solution would be to load the data when the counters are not loading, but this solution increases the cost of the PLL by increasing the number of pins because a "COUNTER LOADING" signal must be provided. In addition, the MPU must monitor the COUNTER LOADING signal which increases software complexity.

Second, when an input number is provided by microprocessor 32, and the first problem does not occur, a large amount of time may be required before a corresponding counter reloads the number. If microprocessor 32 updates the counter value shortly after the counter reloads the number from storage and control portion 12, then the amount of time using an old counter value is relatively large. This problem is worse when the frequency of $FR_{OUT}$ is to be changed from low to high, because the counter value for the low frequency is much greater. Having to wait up to a full counter cycle degrades performance and increases lock time.

Third, phase detector 18 is implemented as a state machine with two state variables. When the state machine is in state "00", then neither counter 14 nor counter 16 has reached terminal count. When a counter reaches terminal count, counter 14 or counter 16 asserts a F1 or F2, respectively, to phase detector 18. If the terminal count signal of one counter is asserted before the terminal count signal of the other counter, then the state machine goes into a "10" or "01" state. Filter 20 and voltage controlled oscillator 22 use this state informatin to adjust the output frequency until the other counter reaches terminal count. When both F1 and F2 have been asserted, then the state machine enters the "11" state which resets the state machine to the "00" state, and keeps the frequency of $FR_{OUT}$ constant. Each counter loads a value when terminal count is reached, or on the assertion of F1 or F2, respectively. A problem occurs when a new value for either the first number or the second number is loaded when the phase detector is in a state other than "00". In this case, lock times increase when a new value is loaded.

Fourth, when an input number is received, the counter 14 and counter 16 are not likely to be synchronized, i.e., both asserting terminal count, when the value changes. In order to minimize lock times, both counter 14 and counter 16 should begin decrementing at the same time. Phase locked loop 10 solves each of these four problems, in a manner made clear by considering FIG. 2 and FIG. 3.

Figure 2:
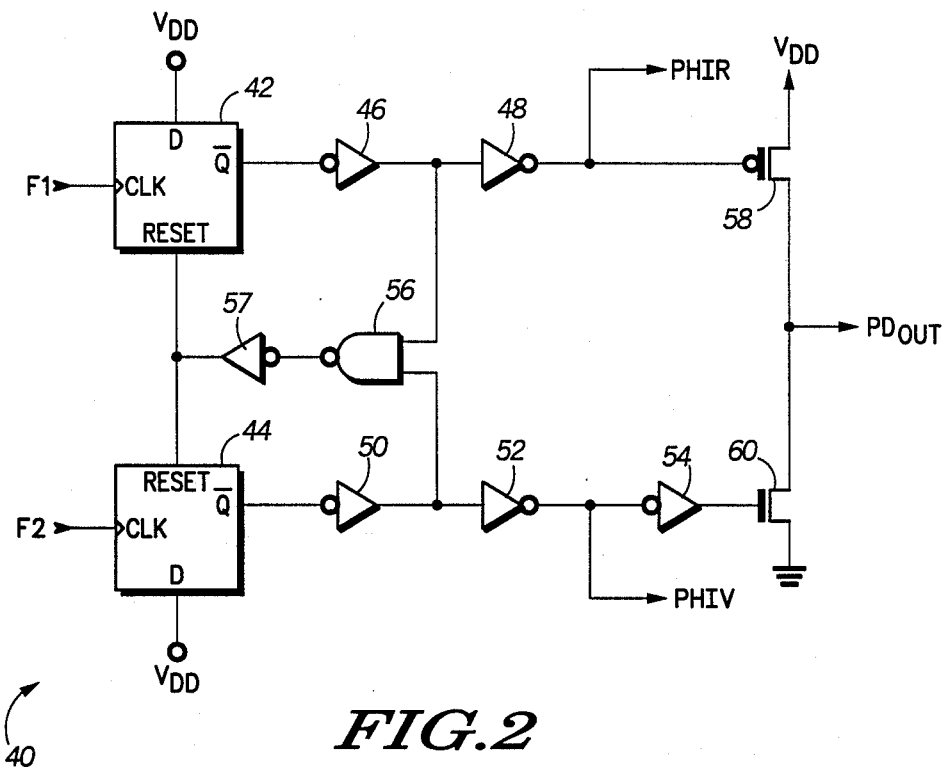
FIG. 2 shows a schematic of a phase detector used in the phase locked loop of FIG. 1.

FIG. 2 shows a schematic of a phase detector 40 used in the phase locked loop of FIG. 1. Phase detector 40 comprises a flip-flop 42, a flip-flop 44, an inverter 46, an inverter 48, an inverter 50, an inverter 52, an inverter 54, a NAND gate 56, an inverter 57, a P-channel transistor 58, and an N-channel transistor 60. Flip-flop 42 has a clock input terminal labelled "CLK" receiving F1, a D input coupled to a first power supply voltage terminal labelled "$V_{DD}$", a reset terminal, and an inverted output terminal labelled "$\overline{Q}$". $V_{DD}$ is a positive power supply voltage terminal and is approximately 5 volts. Flip-flop 44 has a clock input terminal labelled "CLK" receiving F2, a D input coupled to VDD, a reset terminal, and an inverted output terminal labelled "$\overline{Q}$". Inverter 46 has an input terminal coupled to the inverted output terminal of first flip-flop 42, and an output terminal. Inverter 48 has an input terminal coupled to the output terminal of inverter 46, and an output terminal for providing a first phase output signal labelled "PHIR". Inverter 50 has an input terminal coupled to the inverted output terminal of second flip-flop 44, and an output terminal. Inverter 52 has an input terminal coupled to the output terminal of inverter 50, and an output terminal for providing a second phase output signal labelled "PHIV". Inverter 54 has an input terminal coupled to the output terminal of inverter 52, and an output terminal. NAND gate 56 has a first input terminal coupled to the output terminal of inverter 46, a second input terminal coupled to the output terminal of inverter 50, and an output terminal. Inverter 57 has an input terminal coupled to the output terminal of NAND gate 56, and an output terminal coupled to the reset terminal of flip-flop 42 and to the reset terminal of flip-flop 44. Transistor 58 a first current electrode coupled to VDD, a control electrode coupled to the output terminal of inverter 48, and a second current electrode for providing a phase detect output signal labelled "PDOUT". Transistor 60 has a first current electrode coupled to the second current electrode of transistor 58, a control electrode coupled to the output terminal of inverter 54, and a second current electrode coupled to a second power supply voltage terminal labelled "$V_{SS}$". $V_{SS}$, is a negative power supply voltage terminal and is approximately 0 volts.

In operation, the output terminals of inverters 46 and 50 provide signals equivalant to the Q outputs of flip-flops 42 and 44, respectively. NAND gate 56 with inverter 57 provides an AND function. Therefore, flip-flops 42 and 44 are reset when F1 and F2 are both asserted (at a logic high), and the inverted outputs return to a logic high. Flip-flops 42 and 44 are edge-triggered, so that once set, the flip-flops remain set until they are reset. When F1 is asserted when F2 is negated, phase detector 40 provides $PD_{OUT}$ at a logic high level. This logic high level increases the voltage on $FILTER_{OUT}$, increasing the frequency of $FR_{OUT}$. $PD_{OUT}$ remains at a logic high level until F2 is asserted. When F1 is negated when F2 is asserted, phase detector provides $PD_{OUT}$ at a logic low level. This logic low level decreases the voltage on $FILTER_{OUT}$, decreasing the frequency of $FR_{OUT}$. $PD_{OUT}$ remains at a logic low level until F1 is asserted. When F1 and F2 are both negated, and flip-flops 42 and 44 are in the reset state, $PD_{OUT}$ is in a high impedance state, which keeps the voltage on $FILTER_{OUT}$ and the frequency of $FR_{OUT}$ substantially constant.

An important measure of performance of a phase locked loop is the lock time, that is, how long from a change of the first or second numbers until the frequency of $FR_{OUT}$ substantially equals the desired frequency. Furthermore, in a digital phase detector, the lock time of the loop depends on the initial conditions of the phase detector. When the frequency is changed, F1 and F2 are forced into a logic high state by the assertion of JAM LOAD by storage and control portion 12, which puts the flip-flops back into the "00" state (solving the third problem). Since the counters reload the input numbers when F1 and F2 are both at a logic high, they are now synchronized upon a change in the input number (the fourth problem). Also the counters automatically reload their corresponding numbers whenever a number is changed (the second problem).

Figure 3:
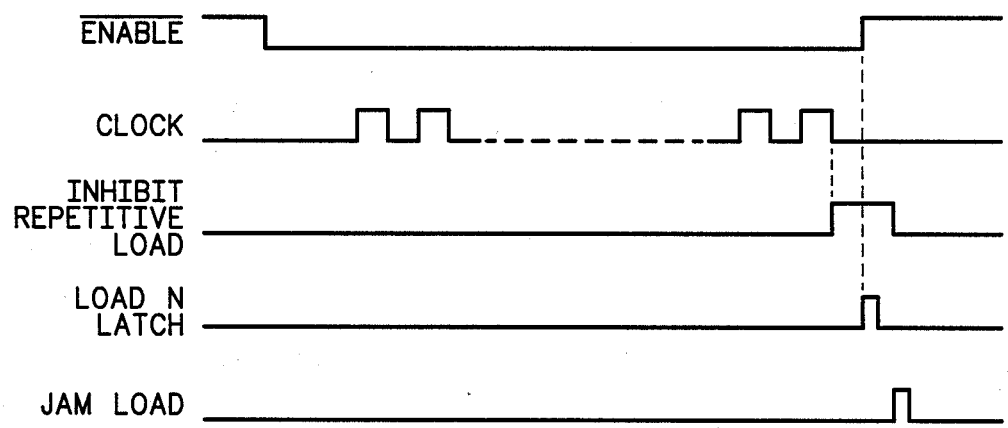
FIG. 3 shows a timing diagram useful in understanding the phase locked loop of FIG. 1.

FIG. 3 shows a timing diagram of various signals of phase locked loop 10 useful in understanding the operation. All reference numbers pertain to FIG. 1. Microprocessor 32 asserts $\overline{ENABLE}$ to program phase locked loop 10. A CLOCK signal is also provided, which is a digital clock signal with approximately 50% duty cycle. Not shown in FIG. 3 is the stream of bits on DATA, which includes an address bit followed by sixteen data bits of the input number. On the falling edge of the CLOCK cycle corresponding to the sixteenth bit of the input number, storage and control portion 12 may assert a signal labelled "INHIBIT REPETITIVE LOAD" to counters 14 and 16, to prevent a load from occuring when the value of either the first latch or the second latch is changing. A signal labelled "LOAD N LATCH" is provided internally by storage and control portion 12 to cause the second latch to receive the input number from the shift register. Finally, JAM LOAD is asserted to ensure that counters 14 and 16 load new values. In the preferred embodiment, INHIBIT REPETITIVE LOAD is not necessary; in certain integrated circuit technologies, like fast CMOS processes, signal JAM LOAD is valid very soon after the rising edge of $\overline{ENABLE}$.

The manner of generating F1 and F2 eliminates the contention problem with the counters (the first problem). Storage and control portion 12 provides a signal labelled "INHIBIT REPETITIVE LOAD" to counters 14 and 16 so that when storage and control portion 12 is providing a new number to the first latch or the second latch, counter 14 and counter 16 do not assert F1 and F2. A ripple counter counts to 16 and then asserts INHIBIT REPETITIVE LOAD for one cycle, during which time the input number is stabilizing in the latch. Subsequently, after the last cycle in which the microprocessor is writing the input number to storage and control portion 12, a signal labelled JAM LOAD is asserted to force counters 14 and 16 to assert F1 and F2, respectively. Together, signals INHIBIT REPETITIVE LOAD and JAM LOAD ensure that contention is avoided.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

I claim:

1. A phase locked loop comprising:
    input means, for storing first and second predetermined numbers in response to a plurality of input signals;
    first counter means coupled to said input means, for receiving a reference signal, for storing said first predetermined number, for providing a first signal in response to either an occurrence of substantially said first predetermined number of cycles of said reference signal or to said input means storing either said first or said second predetermined number;
    second counter means coupled to said input means, for receiving an output signal, for storing said second predetermined number, for providing a second signal in response to either an occurrence of substantially said second predetermined number of cycles of said output signal or to said input means storing either said first or said second predetermined number;
    a phase detector coupled to said first counter means and to said second counter means, for providing a phase detect output signal in response to a difference in logic state between said first and second signals;
    filter means coupled to said phase detector, for providing a filtered signal having a voltage proportional to a length of time said phase detector output signal is in a predetermined logic state; and a voltage controlled oscillator, coupled to said filter means and said second counter, for providing said output signal having a frequency proportional to said voltage of said filtered signal.

2. The phase locked loop of claim 1 wherein said first counter means updates said first predetermined number in response to said first signal, and wherein said second counter means updates said second predetermined number in response to said second signal.

3. The phase locked loop of claim 2 wherein said phase detector comprises:
- a first flip-flop, having a clock input receiving said first load signal, a D input coupled to a signal in a logic high state, a reset terminal, and an inverted output terminal;
- a second flip-flop, having a clock input receiving said second load signal, a D input coupled to a signal in a logic high state, a reset terminal, and an inverted output terminal;
- a first inverter, having an input terminal coupled to said inverted output terminal of said first flip-flop, and an output terminal;
- a second inverter, having an input terminal coupled to said output terminal of said first inverter, and an output terminal for providing a first phase output signal;
- a third inverter, having an input terminal coupled to said inverted output terminal of said second flip-flop, and an output terminal;
- a fourth inverter, having an input terminal coupled to said output terminal of said third inverter, and an output terminal for providing a second phase output signal;
- a fifth inverter, having an input terminal coupled to said output terminal of said fourth inverter, and an output terminal;
- an AND gate, having a first input terminal coupled to said output terminal of said first inverter, a second input terminal coupled to said output terminal of said third inverter, and an output terminal coupled to said reset terminal of said first flip-flop and to said reset terminal of said second flip-flop;
- a first transistor, having a first current electrode coupled to a first power supply voltage terminal, a control electrode coupled to said output terminal of said second inverter, and a second current electrode for providing said phase detect output signal; and
- a second transistor, having a first current electrode coupled to the second current electrode of said first transistor, a control electrode coupled to said output terminal of said fifth inverter, and a second current electrode coupled to a second power supply voltage terminal.

4. The phase locked loop of claim 3, wherein said first power supply voltage terminal is a positive power supply voltage terminal, and wherein said second power supply voltage terminal is a negative power supply voltage terminal.

5. The phase locked loop of claim 1, wherein said predetermined logic state is a logic high.

6. A phase locked loop comprising:
- input means, for storing first and second predetermined numbers in response to a plurality of input signals;
- reference means coupled to said input means, for providing a first signal in response to counting substantially said first predetermined number of cycles of a reference signal, for providing a second signal in response to counting substantially said second predetermined number of cycles of an output signal, and for providing both said first signal and said second signal in response to said input means storing either said first predetermined number or said second predetermined number;
- phase detection means coupled to said reference means, for providing a phase difference signal in response to a difference in logic state between said first signal and said second signal; and
- loop means coupled to said phase detection means and to said reference means, for providing said output signal having a frequency proportional to said phase difference signal.

7. The phase locked loop of claim 6, wherein said reference means updates said first predetermined number in response to providing said first signal, and updates said second predetermined number in response to providing said second signal.

8. The phase locked loop of claim 6, wherein said first signal and said second signal are digital signals.

9. The phase locked loop of claim 8, wherein said predetermined logic state is a logic high.

10. A method of providing an output signal having a programmable frequency comprising the steps of:
- providing a first signal in response to an occurrence of a first predetermined number of cycles of a reference signal;
- providing a second signal in response to an occurrence of a second predetermined number of cycles of the output signal;
- providing both said first signal and said second signal in response to a change in either said first predetermined number or said second predetermined number;
- providing a phase detect signal having a duty cycle proportional to a detected phase difference between said first signal and said second signal;
- providing a filtered signal having a voltage proportional to said duty cycle; and
- providing the output signal having a frequency proportional to said voltage of said phase detect signal.

* * * * *

UNITED STATES PATENT AND TRADEMARK OFFICE
CERTIFICATE OF CORRECTION

PATENT NO.       : 4,951,005
APPLICATION NO. : 07/457465
DATED            : August 21, 1990
INVENTOR(S)      : David C. Babin Page 1 of 1

It is certified that error appears in the above-identified patent and that said Letters Patent is hereby corrected as shown below:

In Column 8, Line 55, Claim 10,

Change "said voltage of said phase detect signal." to --said voltage of said filtered signal.--

Signed and Sealed this

Fourth Day of November, 2008

JON W. DUDAS
*Director of the United States Patent and Trademark Office*